United States Patent [19]

Marchand et al.

[11] 4,377,005
[45] Mar. 15, 1983

[54] ULTRA-HIGH FREQUENCY HYBRID MIXER

[75] Inventors: Maurice Marchand; Yan Haentjens, both of Boulogne Billancourt, France

[73] Assignee: LMT Radio Professionnelle, France

[21] Appl. No.: 297,043

[22] Filed: Aug. 27, 1981

[30] Foreign Application Priority Data

Sep. 9, 1980 [FR] France ............................ 80 19414

[51] Int. Cl.³ ............................................. H04B 1/26
[52] U.S. Cl. ..................................... 455/327; 455/330
[58] Field of Search ............................. 455/325–328, 455/330; 332/43 B

[56] References Cited

U.S. PATENT DOCUMENTS

| | | | |
|---|---|---|---|
| 3,512,091 | 5/1970 | Blixt et al. | 455/327 |
| 3,950,703 | 4/1976 | Reindel | 455/327 |
| 4,249,263 | 2/1981 | Shinkawa et al. | 455/327 |

FOREIGN PATENT DOCUMENTS

2525468 12/1976 Fed. Rep. of Germany ...... 455/327

*Primary Examiner*—Jin F. Ng

[57] ABSTRACT

A mixer comprising two microstrip plates, each having an earth plane, a dielectric layer and an etched layer. One of the etched layers carries the mixer ring and input guides. The outer etched layer carries the output guide and the tuning members. The plate are joined by their earth planes and the mixer diodes are placed in the holes connecting the two etched faces.

7 Claims, 4 Drawing Figures

ULTRA-HIGH FREQUENCY HYBRID MIXER

BACKGROUND OF THE INVENTION

The present invention relates to ultra-high frequency (UHF) hybrid mixers making it possible to obtain from two radio signals a third radio signal, whose frequency is equal to the difference of those of the first two signals. Such mixers are particularly useful for coherent Doppler radars in which all the signals are obtained from a local crystal oscillator, whose frequency and phase are very stable.

In a special construction of such a radar, a double frequency change is used in the reception chain. The first frequency change is carried out by means of a mixer, which receives on the one hand the reception signal, whose frequency is between 9300 and 9900 MHz and on the other hand a signal from the transmission chain, whose frequency is between 7440 and 8040 MHz. The choice within these ranges takes place on transmission and the frequency difference between these two signals is constant and equal to 1860 MHz.

This is the frequency of the signal resulting from this mixture and obtained at the mixer output. It is relatively high and consequently special precautions must be taken in connection with the construction of the mixer in order to prevent losses and mismatches liable to too greatly attenuate the thus obtained intermediate frequency signal.

BRIEF SUMMARY OF THE INVENTION

In order to obviate these losses and mismatches, the present invention proposes an ultra-high frequency hybrid mixer of the type comprising a mixer ring of the type $(3\lambda/2)$, a first waveguide connected at a first point to the outside of said ring for supplying it with the first signal having a first frequency, a second waveguide connected to the outside of the ring at a second point at $(\lambda/2)$ from the first point for supplying the ring with a second signal having a second frequency, said first and second frequencies determining the parameter $\lambda$, a first and second diode connected on one side to the ring respectively on either side of the first point at $(\lambda/4)$ and from the other side to a third waveguide making it possible to supply a third signal, whose frequency is the difference between the first and second frequencies, wherein the ring and the first and second waveguides are etched on a first metal layer resting on a first dielectric layer, the third waveguide is etched on a second metal layer resting on a second dielectric layer superimposed on the first dielectric layer and separated therefrom by at least a third metal layer forming an earth plane and wherein the sandwich plate formed by these layers is provided with two holes contiguous to the ring and in which are located the two diodes, whose connections are joined to the ring on the top of the sandwich plate and to the third guide on the bottom of the sandwich plate.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

An existing technology for producing ultra-high frequency circuits consists of using a plate formed by a dielectric layer sandwiched between a first solid metal layer forming the earth plane and a second metal layer on which is etched, e.g. chemically connections forming lines or guides of the ultra-high frequency type. The characteristic impedance of these lines is dependent on the width of the connections and the permittivity of the dielectric material. The wavelength in the guides depends on the same permittivity. Thus, by acting on the said width and said permittivity it is possible to obtain reasonable dimensions even at very high frequencies, together with the desirable impedance for the connections of the devices and between their individual components. This technology is also known as "microstrip" technology.

Figure 1:
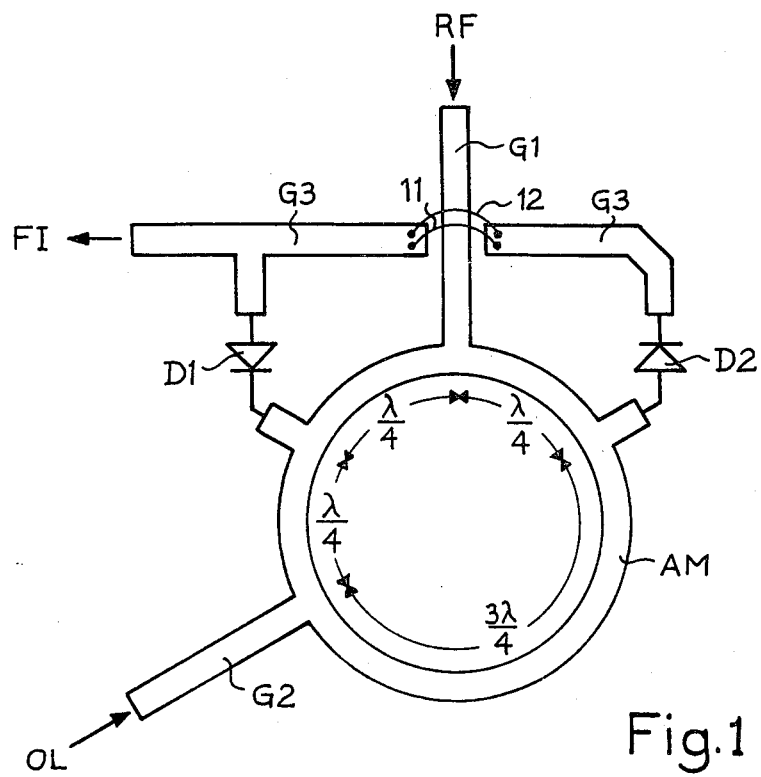
FIG. 1 a circuit diagram of a known mixer.

In this way, it is possible to produce a mixer, like that shown in FIG. 1. It comprises a ring AM, whose circumference is three half-wavelengths i.e. $(3\lambda/2)$ in the circuit at an average frequency between that of the reception signal and that of the local oscillator. The reception signal RF is applied to a first waveguide G1 connected to the outside of ring AM at a first point. The signal OL of the local oscillator is applied to a second waveguide G2 connected to the outside of the ring at a distance equal to $(\lambda/2)$ from the first point.

A first mixer diode D1 is connected by its cathode to a short guide fragment connected to the outside of the ring at a median point with respect to the two guides G1 and G2 and at $(\lambda/4)$ therefrom. A second mixer diode D2 is connected by its anode to another short guide fragment connected to the outside of the ring at a point located at $(\lambda/4)$ from G1 and at $(3\lambda/4)$ from G2.

The anode of D1 and the cathode of D2 are connected by two other short guide fragments to a third guide G3, at the end of which appears the intermediate frequency signal F1 resulting from the mixing between signals RL and OL.

In the arrangement shown in the drawing, to permit the crossing of G1 and G3, it is necessary to make a cut or groove in the latter. To ensure the continuity of the guide, it is then necessary to connect the two edges of the groove by means such as the two wires 11 and 12 shown in the drawing and which project over G1.

The topology shown in FIG. 1 for this type of mixer is not unique and other topologies are conceivable. However, in all cases, there is a crossing of the two guides making it necessary to cut one of them and join the lips of this cut or groove by means such as wires 11 and 12.

According to the invention, the circuits located on either side of diodes D1 and D2 are separated by forming them separately on the layers reserved for the guides of two microstrip plates. These plates are then joined by superimposing them in order to bring into contact the layers forming earth planes and with an arrangement such that the connection points of the output guide for the intermediate frequency signal to the mixer diodes essentially coincide with the connection points of said diodes to the ring. The electrical continuity of the earth planes and the reciprocal immobilization of the plates are obtained e.g. by welding the planes to one another. In order to connect the output guide to the ring by diodes, the plates are perforated at the connection points and UHF diodes in microboxes are inserted into the holes. The width of such a box is such that it essentially corresponds to the thickness of the two superimposed plates and the output connections of these boxes are level with the points to which they must be connected on the faces etched on the plates.

Figure 2:
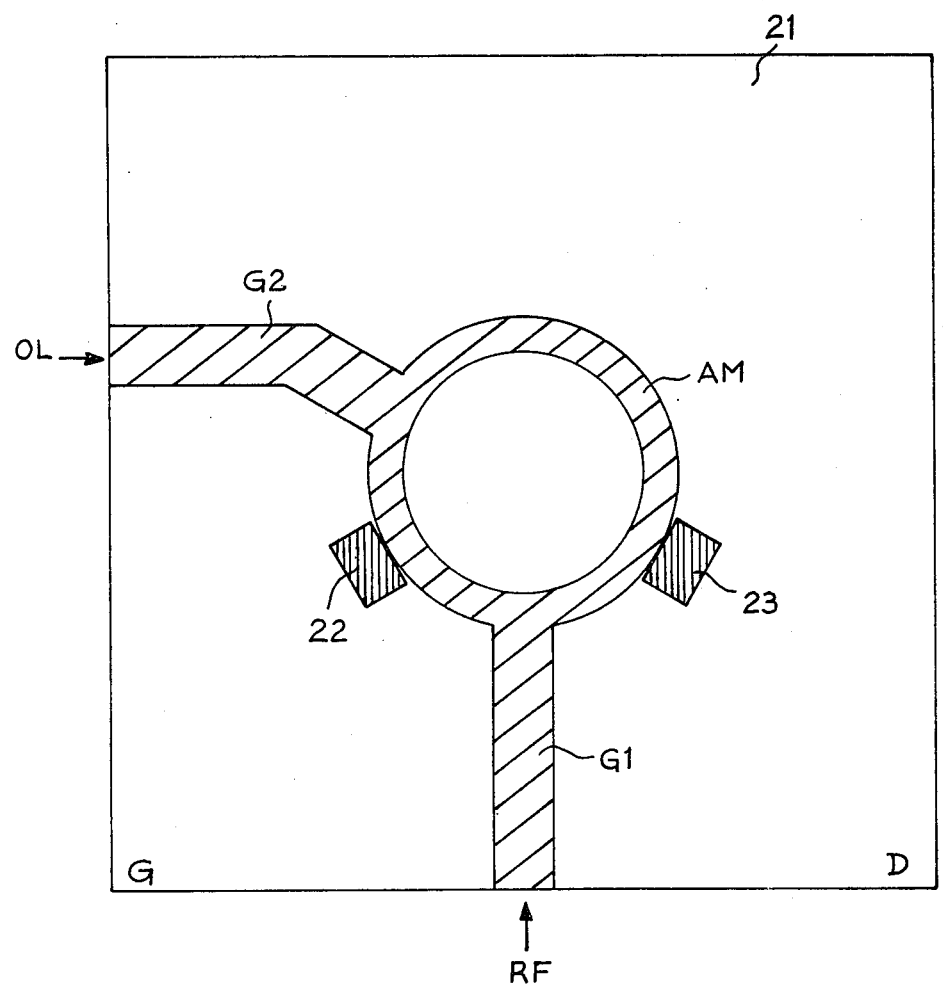
FIGS. 2 and 3 the upper and lower faces of a mixer according to the invention.
Figure 3:
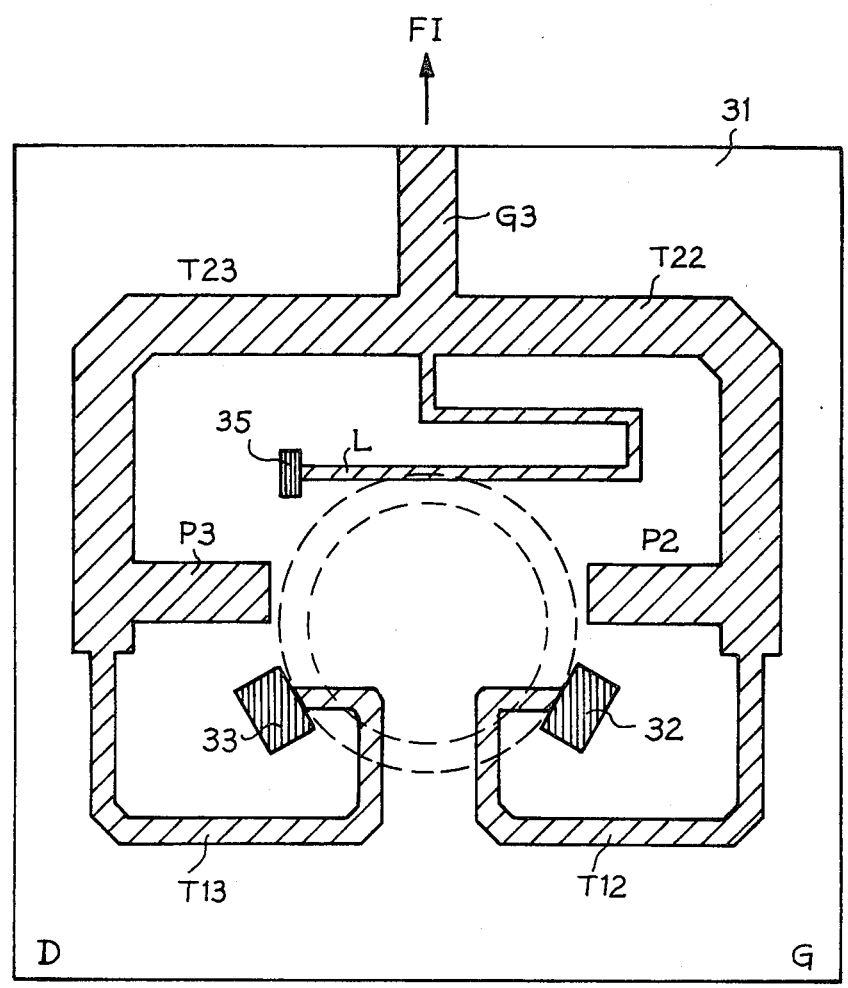

The two etched faces of the two plates used in a special construction of such a mixer are shown in FIGS. 2 and 3 in a direction such that letters D and G are superimposed when the plates are joined back to back. This special construction corresponds to a mixer able to operate in the aforementioned frequency range and the drawing is essentially at scale 4 for a dielectric material, whose thickness is 0.8 mm and whose relative permittivity is 2.2.

The face shown in FIG. 2 has on the surface of a substantially square dielectric plate 21 a ring AM of dimension (3λ/2), a guide G1 connected to said ring and a guide G2 connected to the ring at a distance (λ/2) from the connection point of G1. Guides G1 and G2 make it possible to respectively receive the reception signals RF and the local oscillator OL.

Two substantially rectangular holes 22, 23 are made in the thickness of the dielectric material and the earth plane positioned below the latter in the drawing. Thus, they traverse the plate. They are positioned so as to be tangential to ring AM at two points located on either side of the connection points of guide G1 at a distance of (λ/4).

The other etched face shown in FIG. 3 has a guide G3 and different matching circuits on the surface of a dielectric plate 31, which is identical to plate 21. Guide G3 makes it possible to supply the intermediate frequency signal FI.

Two holes 32, 33 are superimposed on holes 22, 23 and are also made in the dielectric plate and in the earth plane positioned below the latter. Ring AM is shown by transparency to clearly demonstrate its position relative to holes 32,33.

The UHF diodes are shaped like two small parallelepipedic boxes having on two opposite faces tongues which form the output connections. The distance between the opposite faces is essentially the same as that of the thickness of the two plates when they are welded to one another by their earth planes. The dimensions of holes 22, 23, 32, 33 are defined in such a way as to bring about gentle friction between the boxes. It is then merely necessary to place the diodes in the holes in the correct direction and to fold the tongues projecting on either side back onto the connections etched on the plates. The operation is completed by welding the thus folded tongues to the connections.

The impedance of these diodes at the operating frequencies used is approximately 250Ω. To obtain a correct efficiency of the mixer, it is necessary to match this impedance to that of guide G3, which is 50Ω according to a widely adopted standard. As there are two diodes, it is then necessary for the impedance of each of them at their junction to G3 to be 100Ω. To obtain a quarter-wave transformer giving this result, its impedance must be approximately 158Ω. A guide having this impedance has a very limited width and causes considerable manufacturing difficulties.

To obviate these difficulties, two quarter-wave transformers in series are used for each diode and in a first period bring the impedance to 20Ω, and then in a second period from 20 to 100Ω. The first two transformers for each diode are respectively T13 and T12 with an impedance substantially equal to 72Ω and the second two transformers T23 and T22 of impedance substantially equal to 44Ω. These transformers are bent so as to occupy less space and surround the location of ring AM by following the sides of plates 31 and then join at the end of guide G3 forming a T at this point.

The longitudinal dimensions (λ/4) of the transformers is clearly calculated on the basis of the frequency of signal FI transmitted at the output of G3, because this forms the useful signal extracted from the diodes. The median value of the range occupied by FI is used.

To ensure that undesirable signals are not superimposed on the aforementioned signal, two traps P3, P2 which make it possible to eliminate undesirable signals are placed perpendicular to T23 and T32 not far from their junctions with T13 and T12. They are tuned to the most probable unwanted signal, i.e. to signal OL, whose level is much higher than signal RF. In any case, RF is attenuated, because its frequency is not too far from that of OL and due to its low level it is also eliminated.

The diodes placed in holes 33 and 32 are polarized by the rectification of signal OL. In order to re-close the circuit, a shock coil L is used in the form of a guide fragment of length (λ/4) (at the frequency of FI), whose one end is connected to the junction point of G3, T23 and T22 and whose other end is connected to earth via a hole 35 made in plate 31 and making it possible to connect it, e.g. by a welding bead to the earth plane located between plates 21 and 31. As the impedance is zero (at the frequency of FI) on said earth plane, it is infinite at the other end, which prevents the passage of FI, but permits the passage of the direct polarization current.

Both coil L and traps P2 and P3 are located in the space left free in the centre of the plate by the diode tuning transformers. It is bent so that it can be received in said space.

Figure 4:
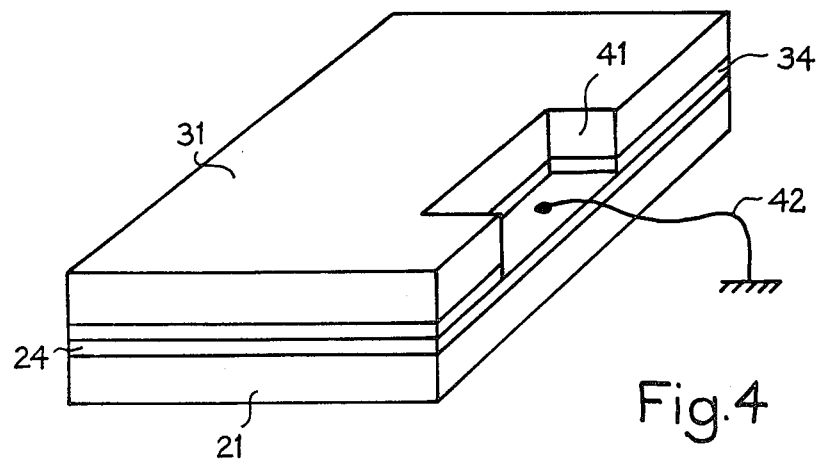
FIG. 4 the thickness structure of such a mixer.

It would be relatively difficult to place an earth contact on the edge of the joined metal layers. Thus, FIG. 4 shows a means for easily obtaining such a contact. The mixer of FIG. 4 has been limited to the two joined microstrip plates without showing the circuits illustrated in FIGS. 2 and 3. Thus, there are two superimposed dielectric 21, 31 having between them the two layers 24, 34 welded together. In the upper sandwich formed by plate 31 and layer 34 a notch 41 is cut along the edge and in the illustrated embodiment this notch is rectangular. This makes it possible to disengage a sufficiently large portion of the surface of layer 24 to weld an earth wire 42.

This structure makes it unnecessary to have any interruptions to the UHF circuit, thereby preventing the impedance breaks resulting therefrom. In the special case corresponding to the frequency ranges referred to hereinbefore a conversion loss as low as 7 dB can be obtained.

The invention also extends to the case when the starting material used is a plate formed by two dielectric layers enclosing a single metal layer forming an earth plane and covered by two outer metal layers making it possible to etch the waveguides. In this case, layers 24 and 34 coincide.

What is claimed is:

1. An ultra-high frequency hybrid mixer which comprises:
   a first dielectric layer having first and second faces;
   a second dielectric layer having third and fourth faces;

at least one conductive layer having a fifth face fixed to the second face and a sixth face fixed to the third face;

a mixer ring of type 3 ($\lambda/2$) located on the first face;

a first waveguide located on the first face and connected to a first point of the outside of the mixer ring;

a second waveguide located on the first face and connected to a second point of the outside of the mixer ring at ($\lambda/2$) from the first point;

a third waveguide positioned on the fourth face;

a first diode positioned in a first hole passing through the two dielectric layers and the conductive layer and directly connected by its cathode at a third point of the mixer ring at ($\lambda/4$) from the second point on one side of said point, and by its anode to the third guide; and a second diode positioned in a second hole passing through the two dielectric layers and the conductive layer and directly connected by its anode to a fourth point of the mixer ring at ($\lambda/4$) from the second point on the other side of said point, and by its cathode to the third guide.

2. A mixer as claimed in claim 1, further comprising a second conductive layer having a seventh face fixed to the sixth face and an eighth face fixed to the third face.

3. A mixer as claimed in claim 2, wherein the seventh and sixth faces are welded together.

4. A mixer as claimed in claim 3, further comprising a shock coil having the shape of a guide section located on the fourth face and connected from one side to the third guide and from the other side to the eighth face by a third hole made in the second layer.

5. A mixer as claimed in claim 4, further comprising a first and a second type $\lambda/4$ transformers located on the fourth face and connected in series to connect the anode of the first diode to the third guide, and a third and a fourth type $\lambda/4$ transformers positioned on the fourth face and connected in series to connect the cathode of the second diode to the third guide.

6. A mixer as claimed in claim 5, further comprising a first trap located on the fourth face and connected to the junction point of the first and second transformers and a second trap located on the fourth face and connected to the junction point of the fourth and third transformers.

7. A mixer as claimed in claim 6, wherein the two dielectric layers and the two conductive layers are substantially square, the mixer ring is located substantially at the centre of the first face, the four transformers are positioned along the edges of the fourth face, the second and fourth transformers are folded towards the centre of the fourth face in order to terminate between the ring and the shock coil, and traps are positioned in the space defined by the four transformers.

* * * * *